US008802977B2

(12) United States Patent
Yuan et al.

(10) Patent No.: US 8,802,977 B2
(45) Date of Patent: Aug. 12, 2014

(54) TECHNIQUES FOR ENHANCING PERFORMANCE OF PHOTOVOLTAIC DEVICES

(75) Inventors: Min Yuan, Yorktown Heights, NY (US); David B. Mitzi, Mahopac, NY (US); Wei Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1241 days.

(21) Appl. No.: 12/118,230

(22) Filed: May 9, 2008

(65) Prior Publication Data
US 2009/0320916 A1    Dec. 31, 2009

(51) Int. Cl.
*H01L 31/0272* (2006.01)
(52) U.S. Cl.
USPC .............................. 136/264; 136/265; 438/95
(58) Field of Classification Search
USPC .................................................. 136/243–265
See application file for complete search history.

(56) References Cited

U.S. PATENT DOCUMENTS

| 2005/0056863 | A1 | 3/2005 | Negami et al. | |
| 2005/0158909 | A1* | 7/2005 | Milliron et al. | 438/85 |
| 2005/0194036 | A1 | 9/2005 | Basol | |
| 2007/0054435 | A1* | 3/2007 | Yoon | 438/48 |
| 2007/0166453 | A1* | 7/2007 | Van Duren et al. | 427/190 |
| 2008/0023336 | A1* | 1/2008 | Basol | 205/182 |

FOREIGN PATENT DOCUMENTS

WO    WO2008013383    1/2008

OTHER PUBLICATIONS

U. Rau, et al., The Inherent Stability of Cu(In,Ga)Se2-Based Solar Cells, 2nd World Conference and Exhibition on Photovoltaic Solar Energy Conversion, Vienna, Austria, Jul. 6-10, 1998.
Ard et al., "Growth of Cu(In,Ga)Se2 Thin Films by Coevaporation using Alkaline Precursors," Thin Solid Films, 361-362, 9-16 (2000).
D. Braunger et al., "Influence of Sodium on the Growth of Polycrystalline Cu(In,Ga)Se2 Thin Films," Thin Solid Films, 361-362, 161-166 (2000).
M.A. Contreras, "Characterization of Cu(In,Ga)Se2 Materials Used in Record Performance Solar Cells," Thin Solid Films vol. 511-512, pp. 51-54 (2006).
M.A. Contreras et al., "Optimization of CBD CdS Process in High-Efficiency Cu(In,Ga)Se2-Based Solar Cells," Thin Solid Films, vol. 403-404, pp. 204-211 (2002).
M.A. Contreras et al., "On the Role of Na and Modifications to Cu(In,Ga)Se2 Absorber Materials using Thin-MF (M=Na, K, Cs) Precursor Layers," 26th PVSC, Sep. 30-Oct. 3, 1997.
S. Duchemin et al., "Studies on the Improvement of Sprayed CdS—CuInSe2 Solar Cells," Proceedings of the 9th EPVSEC, Freiburg, Germany, 476-479 (1989).
J.E. Granata et al., "Quantitative Incorporation of Sodium in CuInSe2 and Cu(In,Ga)Se2 Photovoltaic Devices," 26th PVSC, Sep. 30-Oct. 3, 1997.

(Continued)

*Primary Examiner* — Jonathan Johnson
*Assistant Examiner* — Christina Chern
(74) *Attorney, Agent, or Firm* — Vazken Alexanian; Michael J. Chang, LLC (57) ABSTRACT

Techniques for improving energy conversion efficiency in photovoltaic devices are provided. In one aspect, an antimony (Sb)-doped film represented by the formula, $Cu_{1-y}In_{1-x}Ga_xSb_zSe_{2-w}S_w$, provided, wherein: $0 \leq x \leq 1$, and ranges therebetween; $0 \leq y \leq 0.2$, and ranges therebetween; $0.001 \leq z \leq 0.02$, and ranges therebetween; and $0 \leq w \leq 2$, and ranges therebetween. A photovoltaic device incorporating the Sb-doped CIGS film and a method for fabrication thereof are also provided.

4 Claims, 5 Drawing Sheets

(56) References Cited

OTHER PUBLICATIONS

Guillemoles et al., "Cu(In,Ga)Se2 Solar Cells: Device Stability Based on Chemical Flexibility," Adv. Mater. 11, No. 11 (1999).
J. Hedstrom et al., "ZnO/CdS/Cu(In,Ga)Se2 Thin Film Solar Cells With Improved Performance," IEEE 364-371 (1993).
Tseng et al., "Influences of Sb on the Growth and Properties of CuInSe2 Thin Films," Jpn. J. Appl. Phys. vol. 34, 1109-1112 (1995).
S. Kuranouchi et al., "Sb Doping Effect on Electrical Properties of CuInSe2 Thin Films," 2nd World Conference and Exhibition on Photovoltaic Solar Energy Conversion, Jul. 6-10, 612-615 (1998).
S. Kohiki et al., "Valence Manipulation and Homojunction Diode Fabrication of Chalcopyrite Structure Cu—In—Se thin Films," Thin Solid Films, 226, 149-155 (1993).
Y. Akaki et al., "Structural and Optical Characterization of Sb-Doped CuInS2 Thin Films Grown by Vacuum Evaporation Method," Journal of Physics and Chemistry of Solids, 64, 1863-1867 (2003).
H. W. Schock et al., "CIGS-based Solar Cells for the Next Millennium," Prog. Photovolt. Res. Appl. 8, 151-160 (2000).
A. Kampmann et al., "Electrodeposition of CIGS on Metal Substrates," Mat. Res. Soc. Symp. Proc. vol. 763, B8.5.1-B8.5.6 (2003).
J.A. Hollingsworth et al., "Single Source Precursors for Fabrication of I-III-VI2 Thin-Film Solar Cells Via Spray CVD," Thin Solid Films vol. 431-432, 63-67 (2003).
V. K. Kapur et al., "Fabrication of CIGS Solar Cells Via Printing of Nanoparticle Precursor Inks," Proceedings of the DOE Solar Program Review Meeting, DOE/GO-102005-2067,135-136 (2004).
V.K. Kapur et al., "Nanoparticle Oxides Precursor Inks for Thin Film Copper Indium Gallium Selenide (CIGS) Solar Cells," Mat. Res. Soc. Symp. Proc. vol. 668, H2.6.1 (2001).
N. Tigau, "Substrate Temperature Effect on the Optical Properties of Amorphous Sb2S3 Thin Films," Crystal Research and Technology, vol. 41, 474-480 (2006).
J. Nagao et al., "Ionized Cluster Beam Deposition of Antimony and Bismuth Films," J. Phys. D: Appl. Phys., vol. 32, 134-138 (1999).
M. Kaelin, et al., "Low Cost Processing of CIGS Thin Film Solar Cells," Solar Energy, 749-756 (2004).
M. Kemell, et al., "Thin Film Deposition Methods for CuInSe2 Solar Cells," Critical Reviews in Solid State and Materials Sciences, 30:1-31 (2005).
L. Stolt et al., "ZnO/CdS/CuInSe2 Thin-Film Solar Cells With Improved Performance," Appl. Phys, Lett. vol. 62, No. 5, 597-599 (1993).
M. Lammer et al., "Sodium Co-Evaporation for Low Temperature Cu(In,Ga)Se2 Deposition," Thin Solid Films, vol. 387, 33-36 (2001).
S. Wei et al., "Effects of Na on the Electrical and Structural Properties of CuInSe2," J. Appl. Phys. vol. 85, No. 10, 7214-7218 (1999).
B. M. Keyes et al., "Influence of Na on the Electro-Optical Properties of Cu(In,Ga)Se2," Conf. Rec. 26th IEEE Photovolt. Spec. Conf., Piscataway, NJ, 479 (1997).
D. Rudmann et al., "Effects of NaF Coevaporation on Structural Properties of Cu(In,Ga)Se2 Thin Films," Thin Solid Films, vol. 431-432, 37-40 (2003).

\* cited by examiner

|            | Cu       | In       | Ga      | Se       | S       |
|------------|----------|----------|---------|----------|---------|
| A (NO Sb)  | 23.9(5)  | 16.9(5)  | 8.0(5)  | 44.6(5)  | 6.6(5)  |
| B (0.25% Sb) | 23.3(5) | 16.7(5)  | 7.2(5)  | 46.1(5)  | 6.7(5)  |
| C (0.5% Sb)  | 24.4(5) | 17.0(5)  | 6.6(5)  | 45.9(5)  | 6.1(5)  |

– 100 nm    1.0 mol% Sb, 350°C

TECHNIQUES FOR ENHANCING PERFORMANCE OF PHOTOVOLTAIC DEVICES

FIELD OF THE INVENTION

The present invention relates to photovoltaic devices, such as solar cells, and more particularly, to techniques for enhancing energy conversion efficiency in copper indium gallium selenium (CIGS)-based photovoltaic devices by improved grain structure through antimony (Sb)-doping.

BACKGROUND OF THE INVENTION

Copper ternary chalcogenide compounds and alloys are among the most promising light-absorber materials for solar cell applications and polycrystalline copper indium selenium (often with indium partly replaced by gallium) (CIGS) thin-films, due to their direct (and tunable) energy band gaps, very high optical absorption coefficients in the visible to near-infrared (IR) spectrum range and high tolerance to defects and impurities (see, for example, H. W. Schock et al., "CIGS-based Solar Cells for the Next Millennium," *Prog. Photovolt. Res. Appl.* 8, 151-160 (2000)), have been the focus of extensive investigation for over two decades. The highest efficiency CIGS-based solar cells are traditionally produced by vacuum-based techniques, which require sophisticated vacuum deposition equipment, high processing temperatures (typically above 450 degrees Celsius (° C.)), and usually a post-deposition treatment in a selenium (Se)-rich atmosphere (such as Se vapor or hydrogen selenide/sulfur ($H_2Se/S$)).

However, in an effort to reduce fabrication costs and extend the range of substrates upon which CIGS devices can be integrated, there have been significant efforts to develop lower-temperature, ultra-low-cost solution-based approaches for the fabrication of the CIGS absorber layer for solar cells. A typical challenge faced by these solution-based deposition methods is the difficulty in controlling the grain structure of the CIGS absorber layer. Poor grain structure severely limits solar cell efficiency. Namely, grain boundaries can act as recombination centers for the photogenerated electrons and holes, which are detrimental to the device performance. In general, grain sizes on the order of absorber layer thickness (micrometer (μm)-length scale) are desirable in order to minimize such recombination effects.

Thus, to date the best cell efficiencies achieved from solution-based CIGS absorber growth techniques have reached from about seven percent (%) to about nine % for electrochemical deposition (seven % for simultaneous deposition of all elements and nine % for deposition of metals followed by selenization) (A. Kampmann et al., "Electrodeposition of CIGS on Metal Substrates," *Mat. Res. Soc. Symp. Proc.* Vol. 763, B8.5.1-B8.5.6 (2003); lower than five % for spray pyrolysis/spray chemical vapor deposition (CVD) (S. Duchemin et al., "Studies on the Improvement of Sprayed CdS—$CuInSe_2$ Solar Cells," *Proceedings of the 9$^{th}$ EPVSEC*, Freiburg, Germany, 476-479 (1989); and J. A. Hollingsworth et al., "Single Source Precursors for Fabrication of I-III-$VI_2$ Thin-Film Solar Cells Via Spray CVD," *Thin Solid Films* vol. 431-432, 63-67 (2003); and as high as 13.7% in very small area devices (0.08 square centimeter ($cm^2$)) using nanoparticle-precursor deposition method (V. K. Kapur et al., "Fabrication of CIGS Solar Cells Via Printing of Nanoparticle Precursor Inks," *Proceedings of the DOE Solar Program Review Meeting*, DOE/GO-102005-2067, 135-136 (2004)).

Attempts have been made to enhance solar cell performance in closely-related chemical systems (either gallium (Ga)-free $CuInSe_2$ (CIS) or sulfide instead of selenide, i.e., $CuInS_2$). See, for example, U.S. Patent Application No. 2005/0056863 filed by Negami et al., entitled "Semiconductor Film, Method for Manufacturing the Semiconductor Film, Solar Cell Using the Semiconductor Film and Method for Manufacturing the Solar Cell" (controlling carrier density in a, e.g., CIS light-absorption layer of a solar cell); U.S. Patent Application No. 2005/0194036 filed by Basol, entitled "Low Cost and High Throughput Deposition Methods and Apparatus for High Density Semiconductor Film Growth" (adding, at impurity levels, liquid materials, such as sodium (Na), potassium (K), lithium (Li), phosphorous (P), antimony (Sb) and bismuth (Bi), to an absorber layer to improve the quality of the absorber layer); International Patent Application No. WO2008/013383 filed by LG Chem, LTD., entitled "Method for Preparing CIS Compounds and Thin Layer, and Solar Cell Having CIS Compound Thin Layer" (dopants, such as Na, K, nickel (Ni), P, arsenic (As), Sb and Bi can be used to enhance a CIS absorption layer of a solar cell) and Y. Akaki et al., "Structural and Optical Characterization of Sb-Doped $CuInS_2$ Thin Films Grown by Vacuum Evaporation Method," *Journal of Physics and Chemistry of Solids*, 64, 1863-1867 (2003) (describes structural, electrical and optical properties of Sb-doped $CuInS_2$ thin films without device results). None of these attempts, however, provide an implementable solution to the problem of charge recombination at grain boundaries. Namely, none of the above references directly address with any specifics the grain structure of a CIGS absorber layer and how the grain structure relates to the performance of a solar cell.

Therefore, techniques to improve the grain structure and thereby the performance of CIGS-based solar cells would be desirable.

SUMMARY OF THE INVENTION

The present invention provides techniques for improving energy conversion efficiency in photovoltaic devices. In one aspect of the invention, an antimony (Sb)-doped film represented by the formula, $Cu_{1-y}In_{1-x}Ga_xSb_zSe_{2-w}S_w$, is provided, wherein: $0 \leq x \leq 1$, and ranges therebetween; $0 \leq y \leq 0.2$, and ranges therebetween; $0.001 \leq z \leq 0.02$, and ranges therebetween; and $0 \leq w \leq 2$, and ranges therebetween.

In another aspect of the invention, a photovoltaic device is provided. The photovoltaic device comprises a substrate; and an Sb-doped absorber layer formed on the substrate represented by the formula, $Cu_{1-y}In_{1-x}Ga_xSb_zSe_{2-w}S_w$, wherein: $0 \leq x \leq 1$, and ranges therebetween; $0 \leq y \leq 0.2$, and ranges therebetween; $0.001 \leq z \leq 0.02$, and ranges therebetween; and $0 \leq w \leq 2$, and ranges therebetween. The photovoltaic device can further comprise an n-type buffer layer formed on a side of the Sb-doped absorber layer opposite the substrate; a transparent conductive contact formed on a side of the buffer layer opposite the Sb-doped absorber layer; and a metal grid formed on a side of the transparent conductive contact opposite the buffer layer.

In yet another aspect of the invention, a method of fabricating a photovoltaic device is provided. The method comprises the following steps. A substrate is provided. An Sb-doped absorber layer is formed on the substrate. The Sb-doped absorber layer is represented by the formula, $Cu_{1-y}In_{1-x}Ga_xSb_zSe_{2-w}S_w$, wherein: $0 \leq x \leq 1$, and ranges therebetween; $0 \leq y \leq 0.2$, and ranges therebetween; $0.001 \leq z \leq 0.02$, and ranges therebetween; and $0 \leq w \leq 2$, and ranges therebetween. An n-type buffer layer can be formed on a side of the Sb-doped absorber layer opposite the substrate. A transparent conductive contact can be formed on a side of the buffer layer opposite the Sb-doped absorber layer. A metal grid can be formed on a side of the transparent conductive contact opposite the buffer layer.

A more complete understanding of the present invention, as well as further features and advantages of the present invention, will be obtained by reference to the following detailed description and drawings.

DETAILED DESCRIPTION OF PREFERRED EMBODIMENTS

Figure 1:
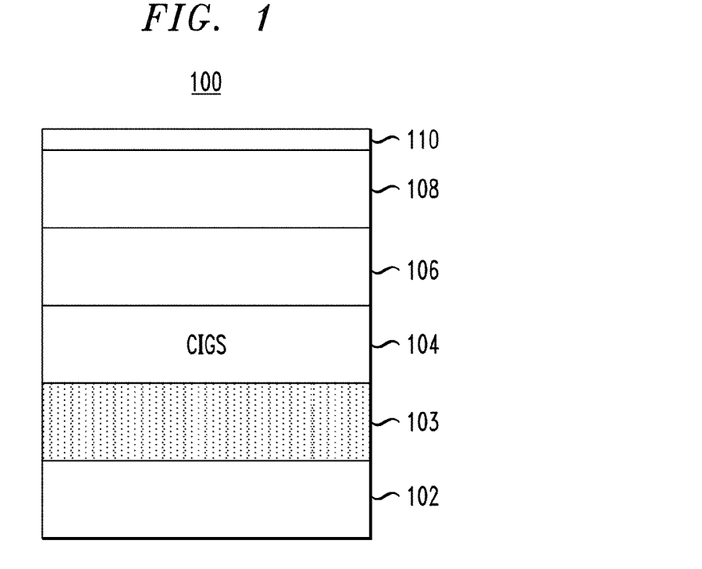
FIG. 1 is a diagram illustrating an exemplary photovoltaic device according to an embodiment of the present invention.

FIG. 1 is a diagram illustrating exemplary photovoltaic device 100. According to an exemplary embodiment, photovoltaic device 100 comprises a solar cell. Photovoltaic device 100 comprises substrate 102, metal layer 103 coated on substrate 102, absorber layer 104 formed on a side of metal layer 103 opposite substrate 102, n-type buffer layer 106 formed on a side of absorber layer 104 opposite metal layer 103, transparent conductive contact, i.e., an electrode, 108 formed on a side of buffer layer 106 opposite absorber layer 104 and metal grid 110 formed on a side of transparent conductive contact 108 opposite buffer layer 106.

Substrate 102 can comprise glass, metal foil or a polyimide sheet (such as Kapton® Polyimide Films manufactured by DuPont, Wilmington, Del.). Metal layer 103, which forms a back contact of photovoltaic device 100, can comprise molybdenum (Mo), tungsten (W) or chromium (Cr) and can be coated on substrate 102 to a thickness of from about 0.5 micrometers (μm) to about one μm. By way of example only, the substrate configuration shown illustrated in FIG. 1 is representative of a, e.g., Mo, W or Cr-coated glass, -coated metal foil or -coated polyimide sheet substrate.

According to the present techniques, grain structure and performance of photovoltaic devices are improved through the introduction of a controlled amount of antimony (Sb) dopant into the absorber layer during device fabrication. Namely, absorber layer 104 comprises an Sb-doped copper (Cu) indium (In) gallium (Ga) selenium (Se) (CIGS) layer represented by the following formula, $Cu_{1-y}In_{1-x}Ga_xSb_zSe_{2-w}S_w$, wherein $0 \leq x \leq 1$, and ranges therebetween; $0 \leq y \leq 0.2$, and ranges therebetween; $0.001 \leq z \leq 0.02$, and ranges therebetween; and $0 \leq w \leq 2$, and ranges therebetween. As will be described below, sulfur (S) may be introduced during formation of the absorber layer. As is apparent from the above formula, the Sb-doping range is preferably from about 0.1 atomic percent (at. %) to about two at. % of that of the sum of In+Ga. Absorber layer 104 can be formed having a thickness of from about 200 nanometers (nm) to about 2.5 μm, for example, from about one μm to about 2.5 μm.

As will be described in detail below, doping the absorber layer with an appropriate amount of Sb allows one to use considerably lower processing temperatures to achieve favorable (i.e., larger) grain structures. Since grain boundaries can act (undesirably) as recombination centers for photogenerated electrons and holes, a larger grain structure provides a reduced number of grain boundaries, which serves to minimize the amount of charge recombination at the grain boundaries and thereby enhance device efficiency.

Further, with the present techniques, temperatures as low as from about 350 degrees Celsius (° C.) to about 375° C. can be employed to produce CIGS-based absorber layers having μm-length scale grain sizes (i.e., on the same order of magnitude as the thickness of the absorber layer), for example, grain sizes of from about 0.2 μm to about two μm, e.g., from about 0.5 μm to about one μm (whereas typical processing temperatures of over 500° C. are required for Sb-free CIGS films to yield grain sizes on a similar scale). According to an exemplary embodiment, the grain size is taken as the greatest dimension (e.g., longest length) of a grain from a cross-section of the absorber layer (see, for example, FIGS. 5A-C).

Thus, the Sb-doped CIGS absorber layers of the present techniques possess significantly larger grain sizes than analogous films processed under the same conditions but without Sb-doping. As will be described in detail below, a completed photovoltaic device having an Sb-doped CIGS absorber layer shows improved device performance compared to an Sb-free analogue.

N-type buffer layer 106 can comprise one or more of cadmium sulfide (CdS) and zinc (Zn)-doped CdS, and can be formed to a thickness of from about 500 angstroms (Å) to about 700 Å. In the completed device, a heterojunction (e.g., a p-n junction) is formed between buffer layer 106 and absorber layer 104, which functions in the generation of electron-hole pairs upon solar illumination.

Transparent conductive contact 108, which forms a front contact of photovoltaic device 100, can comprise a bilayer of intrinsic zinc oxide (ZnO) with indium tin oxide (ITO) or aluminum (Al)-doped ZnO, and can be formed to a thickness of about 2,500 Å. Metal grid 110 can comprise a combination of nickel (Ni) and Al (Ni/Al). Metal grid 110 helps to collect current generated by photovoltaic device 100.

Photovoltaic device 100 represents one exemplary configuration (also known as a "substrate configuration") into which the instant Sb-doped CIGS absorber layer can be incorporated. Other photovoltaic device configurations may also be used. By way of example only, a superstrate photovoltaic device (not shown) incorporating the above-described Sb-doped CIGS absorber layer can be employed. The term "superstrate," refers to a photovoltaic device configuration wherein the substrate (in this case glass), instead of forming a base of the device, forms a top of the device through which solar illumination penetrates into the device.

Figure 2:
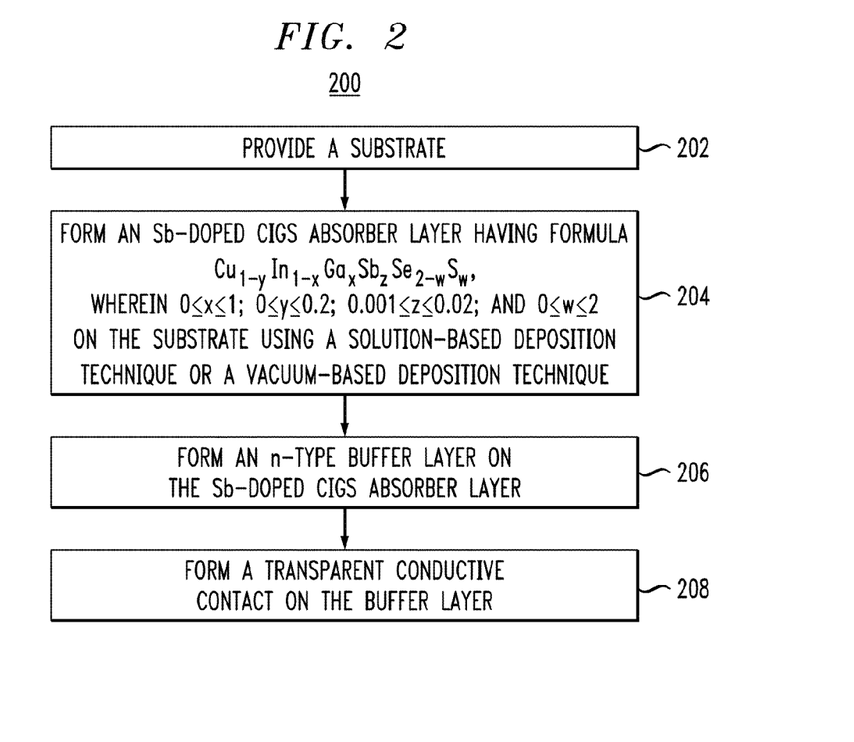
FIG. 2 is a diagram illustrating an exemplary methodology for fabricating a photovoltaic device according to an embodiment of the present invention.

FIG. 2 is a diagram illustrating exemplary methodology 200 for fabricating a photovoltaic device, such as photovoltaic device 100, described in conjunction with the description of FIG. 1, above. In step 202, a substrate is provided. As described above, the substrate can comprise glass, metal foil or a polyimide sheet, and is Mo-, W- or Cr-coated, e.g., using any suitable sputtering technique.

In step 204, an Sb-doped CIGS absorber layer having the formula, $Cu_{1-y}In_{1-x}Ga_xSb_zSe_{2-w}S_w$, wherein 0≤x≤1, and ranges therebetween; 0≤y≤0.2, and ranges therebetween; 0.001≤z≤0.02, and ranges therebetween; and 0≤w≤2, and ranges therebetween, is formed on the substrate using any one of a number of suitable deposition techniques. Suitable deposition techniques for forming the Sb-doped CIGS absorber layer on the substrate include, but are not limited to, solution-based deposition techniques, such as spin-coating, spraying, electrodeposition and/or ink jet printing, and vacuum-based deposition techniques, such as sputtering and/or evaporation. These deposition techniques will be described in detail below.

By way of example only, when a solution-based deposition technique, such as spin-coating, is used to form the Sb-doped CIGS absorber layer, an Sb-doped CIGS solution is first prepared (e.g., with Sb being introduced into the CIGS solution by dissolving antimony trisulfide ($Sb_2S_3$) in hydrazine, as described in detail below). The Sb-doped CIGS solution is then deposited on the substrate using spin-coating. The spin-coated substrate is then heated (an intermediate anneal). The spin-coating/annealing steps can be repeated multiple times to form the Sb-doped CIGS absorber layer to a desired thickness (for example, from about 200 nm to about 2.5 μm, e.g., from about one μm to about 2.5 μm, see above). The last deposition step is followed by a final anneal (e.g., at a higher temperature than the intermediate anneal).

In step 206, an n-type buffer layer is formed over a side of the Sb-doped CIGS absorber layer opposite the substrate. According to an exemplary embodiment, the buffer layer is formed over the Sb-doped CIGS absorber layer using a standard chemical bath deposition technique. See, for example, M. A. Contreras et al., "Optimization of CBD CdS Process in High-Efficiency Cu(In,Ga)Se$_2$-Based Solar Cells," *Thin Solid Films*, vol. 403-404, pp. 204-211 (2002) (hereinafter "Contreras (2002)"), the contents of which are incorporated by reference herein.

In step 208, a transparent conductive contact is formed over a side of the buffer layer opposite the Sb-doped CIGS absorber layer. According to an exemplary embodiment, the transparent conductive contact is formed by first sputtering a ZnO layer onto the buffer layer and then sputtering an ITO layer over the ZnO layer (see below).

The present techniques are further described by reference to the following non-limiting examples:

Example 1

This example uses spin-coating as a deposition technique to demonstrate the differences between CIGS thin films prepared with and without Sb-doping. In particular, the grain size enhancement effect upon the addition of Sb will be illustrated (at two temperature sets, 350° C. and 400° C.). The effects of Sb on $CuInSe_2$ (CIS), the Ga-free analogue of CIGS, were described in U.S. patent application Ser. No. 11/951,858, filed by Mitzi et al., entitled "Improved Photovoltaic Device with Solution-Processed Chalcogenide Absorber Layer," the contents of which are incorporated by reference herein.

The solutions used for the thin-film deposition were prepared in an inert atmosphere in two steps. First, a solution was prepared for each individual component metal chalcogenide, at room temperature. Next, these component solutions (some with and some without the Sb component) were mixed in appropriate ratios to yield a stoichiometric solution for a targeted overall CIGS composition, see below.

Five component solutions, i.e., component solutions (a)-(e), were prepared by dissolving a Cu source, an In source, a Ga source, an Se source and an Sb source in hydrazine as follows. Component solution (a) contained four millimoles (mmol) copper sulfide ($Cu_2S$) (0.637 grams (g)) and eight mmol S (0.256 g) dissolved in eight milliliter (mL) of anhydrous hydrazine, forming a clear yellow solution. Component solution (b) contained four mmol indium selenide ($In_2Se_3$) (1.8661 g) and four mmol Se (0.316 g) dissolved in 12 mL of anhydrous hydrazine. After several days, a clear pale yellow and viscous solution formed. Component solution (c) contained four mmol Se (0.316 g) dissolved in two mL of hydrazine. Component solution (d) contained eight mmol Ga (0.558 g) and 16 mmol Se (1.263 g) dissolved in 16 mL of anhydrous hydrazine (after a week of stirring). Component solution (e) contained one mmol $Sb_2S_3$ (0.3397 g) and two mmol S (0.064 g) dissolved in two mL of anhydrous hydrazine, forming a clear bright yellow solution.

Three CIGS absorber layer precursor solutions, i.e., Solution A, Solution B and Solution C, were then prepared from the above initial component solutions for spin-coating, and were allowed to stir for twelve hours at room temperature before deposition. Solution A, Solution B and Solution C were prepared as follows.

Solution A targeting a $CuIn_{0.7}Ga_{0.3}Se_2$ stoichiometry (with no Sb) was prepared by mixing six mL of component solution (a) (containing six mmol of Cu), 6.3 mL of component solution (b) (containing 4.2 mmol In), 3.6 mL of component solution (d) (containing 1.8 mmol Ga), 1.2 mL of component solution (c) (containing 2.4 mmol Se) and 1.38 mL hydrazine.

Sb-doped solutions were then prepared by adding the appropriate amount of component solution (e) to a measured amount of Solution A, the $CuIn_{0.7}Ga_{0.3}Se_2$ solution, as follows.

Solution B targeting a 0.25 mole percent (mol %) Sb-doped $CuIn_{0.7}Ga_{0.3}Se_2$ solution (i.e., $CuIn_{0.7}Ga_{0.3}Sb_{0.0025}Se_2$) was prepared by adding 2.5 microliters (μL) of component solution (e) (containing 0.0025 mmol Sb) to 3.08 mL of Solution A (containing one mmol In+Ga); and Solution C targeting a 0.5 mol % Sb-doped $CuIn_{0.7}Ga_{0.3}Se_2$ solution (i.e., $CuIn_{0.7}Ga_{0.3}Sb_{0.005}Se_2$) was prepared by adding five μL of component solution (e) (containing 0.005 mmol Sb) to 3.08 mL of Solution A (containing one mmol In+Ga).

For each of the Solutions, an excess of Se was added to improve grain growth and to reduce residual S content in the final films (from the $Cu_2S$ in component solution (a)). $Cu_2S$ was used instead of copper selenide ($Cu_2Se$) because $Cu_2S$ has a better solubility than $Cu_2Se$.

The films were deposited in an inert atmosphere by spin-coating (e.g., in a nitrogen-filled drybox) using the above-described CIGS absorber layer precursor solutions. The substrates used were one inch×one inch square glass substrates coated with 100 nm of Mo thereon. The spin cycle included ramping to 800 revolutions per minute (rpm) in three seconds and maintaining this rotation for 100 seconds.

After deposition of the first film layer (also referred to herein as a "precursor film"), the precursor film-coated substrates were first placed on a hot plate (in an inert atmosphere) at 280° C. for 10 minutes as a decomposition step to form $CuIn_{0.7}Ga_{0.3}Se_2$, perhaps with still some extra Se (in excess of what is required from the formula $CuIn_{0.7}Ga_{0.3}Se_2$) incorporated (which is removed after a final anneal). The coated substrates were then removed from the hotplate and cooled to room temperature. The coating process was repeated multiple times to build up film thickness. In successive depositions, the same annealing parameters (280° C. for 10 minutes) were employed between each film layer (the top film layer was subjected to this treatment as well before the final anneal was applied). Then the substrates were heated at 400° C. for 20 minutes as the final anneal.

Rutherford backscattering spectroscopy (RBS) and particle-induced x-ray emission (PIXE) analysis of single-layer analogous films prepared on silicon (Si) substrates (with 40 nm of thermal oxide coating) were used to examine the stoichiometry of the films. Also, X-ray powder diffraction and cross-sectional scanning electron microscope (SEM) images were used to evaluate phase purity and grain size in the resulting films on glass/Mo substrates.

Figure 3:
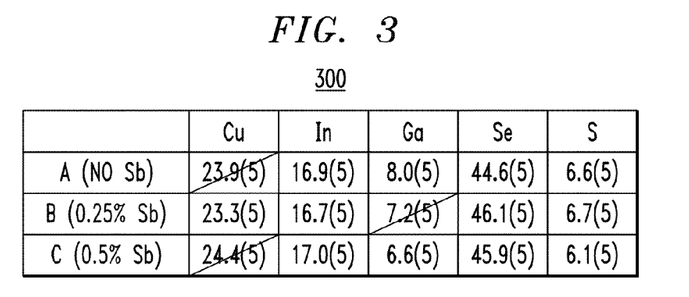
FIG. 3 is a table of Rutherford backscattering spectroscopy (RBS) and particle-induced X-ray emission (PIXE) analysis results for several exemplary copper indium gallium selenium (CIGS) films according to an embodiment of the present invention.

RBS/PIXE analysis results for films formed from Solution A, Solution B and Solution C are illustrated in table 300 of FIG. 3. The results shown in table 300 are in agreement with the targeted film composition. Thus, the expected compositions would have 25 percent (%) Cu, 17.5% In, 7.5% Ga and 50% Se for all three samples (Sb is difficult to measure by RBS as Sb is close in mass to In and is present in too small an amount to be separated from the large In signal). In table 300, the numbers in parentheses indicate the error in the last digit.

There is a small quantity of S detected in the films (about six % relative to the other components). S comes from the $Cu_2S$-containing component solution. The quantity of S in the films, which is represented by "y" in the formula $CuIn_{1-x}Ga_xSe_{2-y}S_y$, can be controlled by controlling the amount of excess Se or S added to the reaction, by controlling the final anneal temperature and/or by controlling the duration of the final anneal. On the other hand, incorporation of S can be potentially useful for tailoring a bandgap of the film.

Figure 4A:
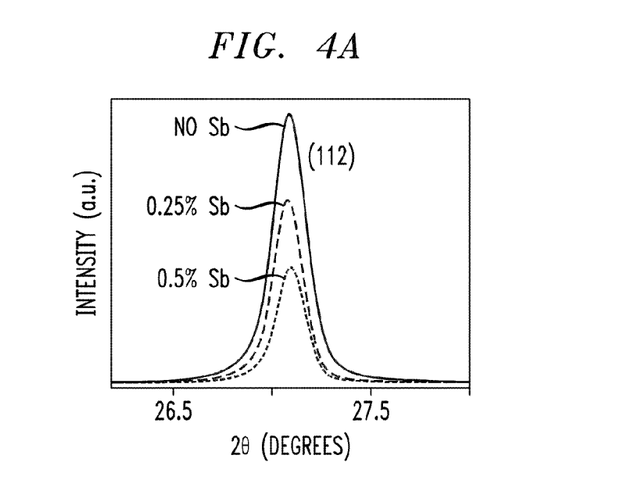
FIGS. 4A-B are X-ray powder diffraction patterns for several exemplary CIGS films according to an embodiment of the present invention.
Figure 4B:
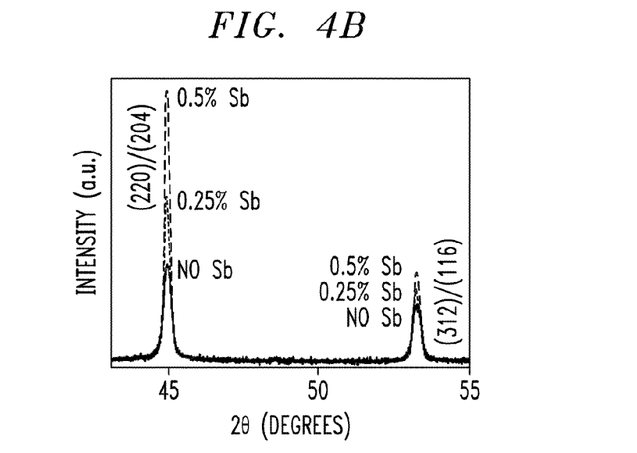

FIGS. 4A-B are X-ray powder diffraction patterns (Cu K-alpha (Kα) radiation) for three films prepared from Solutions A, B and C (i.e., Sb-doped (0.25 mol % and 0.5 mol %) and undoped $CuIn_{0.7}Ga_{0.3}Se_2$ films), on glass (with a 100 nm thick Mo layer on the glass), using five successive deposition cycles and a final anneal at 400° C. The films prepared were about 550 nm thick. The reflections shown are the (112) (FIG. 4A), (220)/(204) and (312)/(116) (FIG. 4B) reflections.

Referring to FIGS. 4A-B, changes in full width at half maximum (FWHM) and peak intensity (arbitrary unit (a.u.)) of the three films are shown. The diffraction peaks grow unambiguously narrower with an increasing amount of Sb-doping, indicating improved crystallinity of the films as a function of Sb-doping level. It is also notable that the films showed stronger preferential orientation along the (220)/(204) and (312)/(116) directions at higher Sb-doping levels, at the expense of the (112) orientation. A strong (220)/(204) orientation, which is preferred, is believed to lead to more homogenous optoelectronic properties and a lower density of nonradiative recombination centers in the film (see, for example, M. A. Contreras, "Characterization of Cu(In,Ga) $Se_2$ Materials Used in Record Performance Solar Cells," *Thin Solid Films* vol. 511-512, pp. 51-54 (2006), the contents of which are incorporated by reference herein).

Figure 5A:
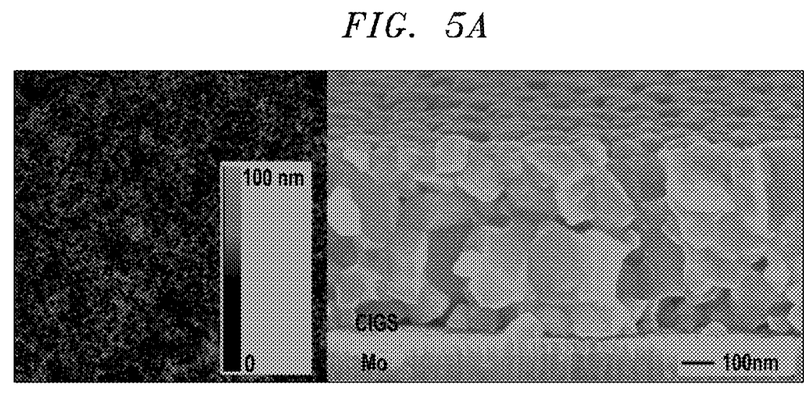
FIGS. 5A-C are cross-sectional scanning electron microscope (SEM) and atomic force microscope (AFM) images of exemplary antimony (Sb)-doped and undoped CIGS films according to an embodiment of the present invention.
Figure 5B:
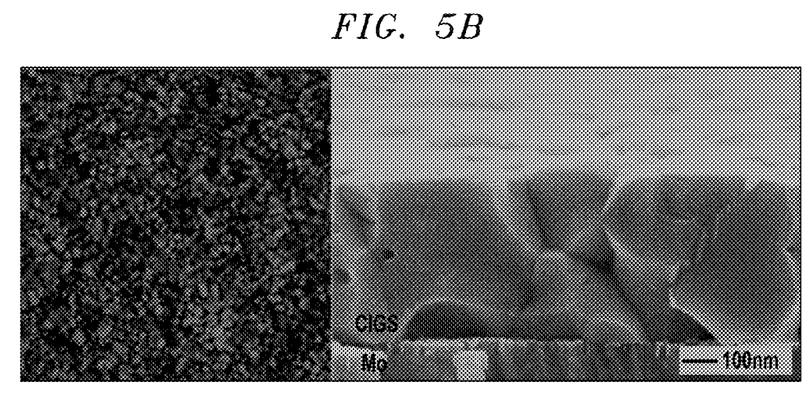
Figure 5C:
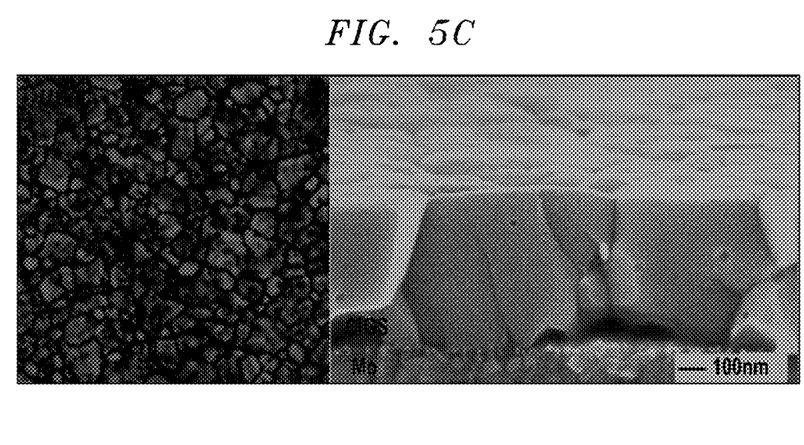

FIGS. 5A-C are diagrams comparing cross-sectional SEM images (on the right) and atomic force microscope (AFM) images (on the left) of the Sb-doped (FIG. 5B) 0.25 mol % and (FIG. 5C) 0.5 mol % and (FIG. 5A) un-doped $CuIn_{0.7}Ga_{0.3}Se_2$ films. The area of each AFM scan is 10×10 µm. In each of these cases, the films were deposited on Mo-coated glass (i.e.,, with 100 nm of Mo deposited by sputtering). All three films were subjected to a final anneal at 400° C. for 20 minutes. All heat treatments (anneals) were performed in the same inert atmosphere, i.e., the same nitrogen-filled drybox, as that used for spin-coating. It is clearly evident that grain size improvements are experienced with the inclusion of a very small amount (0.25 mol %) of Sb dopant, and continuous grain growth was evident (compare FIG. 5B and FIG. 5C) with an increasing amount of Sb-doping. Grain sizes of µm order appear to be readily achievable using this Sb-doping approach at a rather low annealing temperature (400° C.) and for a relatively short period of time (20 minutes).

Figure 6:
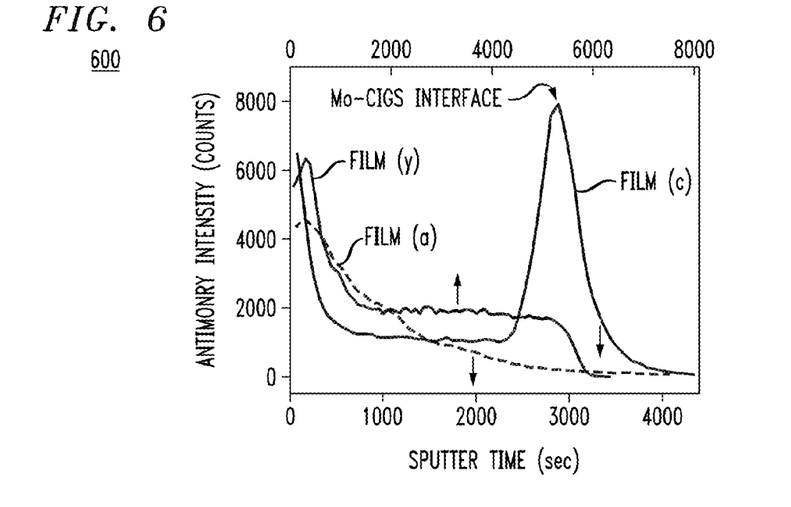
FIG. 6 is a graph illustrating secondary ion mass spectroscopy (SIMS) depth profiles of Sb as a function of sputter time for several exemplary solution-deposited CIGS films with variations in heat treatments applied according to an embodiment of the present invention.

Distribution of Sb in doped films was studied using secondary ion mass spectroscopy (SIMS) which was carried out using eight successive depositions of Solution A (as a control) or Solution C for each individual film. FIG. 6 is graph 600 illustrating SIMS depth profiles of Sb as a function of sputter time (depth into film), measured in seconds, for three solution-deposited (i.e., spin-coated) CIGS films on glass/Mo, one prepared using Solution A (no Sb, film (a)) and two prepared using Solution C (both 0.5 mol % Sb-doped but different final anneals, films (c) and (y)) for eight successive depositions, and subjected to a final anneal at 400° C. for 30 minutes for films (a) and (c), but no final anneal for film (y). Film (y) was still subjected to an intermediate heat treatment of 290° C. after each deposition, as was also applied to films (a) and (c). It is notable that different sputtering time axes (bottom and top) are used to facilitate comparison between the three films (films (a) and (c) correspond to the bottom axis and film (y) corresponds to the top axis, as indicated by arrows in FIG. 6). The approximate position of a Mo-CIGS interface (i.e., interface of the CIGS absorber layer and Mo-coated substrate) is noted in FIG. 6.

From graph 600 it can be seen that the Sb signal is rather uniform within the bulk of film (y), which contained 0.5 mol % Sb but was not subjected to a final anneal, whereas the Sb signal peaks at the Mo-CIGS interface in film (c) (0.5 mol % Sb and 400° C. final anneal), indicating inhomogeneous distribution of Sb and its collection at the Mo-CIGS interface. The background signal from film (a) (no Sb) may be from some other polyatomic ion introduced during the measurement that adds up to the same mass as cesium-antimony (CsSb). An interesting observation associated with this study was the fact that film (y), even doped with Sb but having no final anneal, had very fine grains, while film (c) showed large grains, as illustrated in FIG. 5C (described above).

A minimum Sb-doping level for the grain size improvement effect seems to be determined largely by the annealing temperature. Namely, a higher annealing temperature generally requires a lower minimum Sb-doping level to achieve significant grain size enhancement, whereas a lower annealing temperature requires a higher minimum Sb-doping level. For example, a film with as low as 0.25 mol % Sb dopant showed enhanced grain growth when that film was processed at 400° C., as was demonstrated above, whereas a one mol % Sb inclusion level was needed in a similarly prepared film processed at 350° C. (shown below).

Figure 7A:
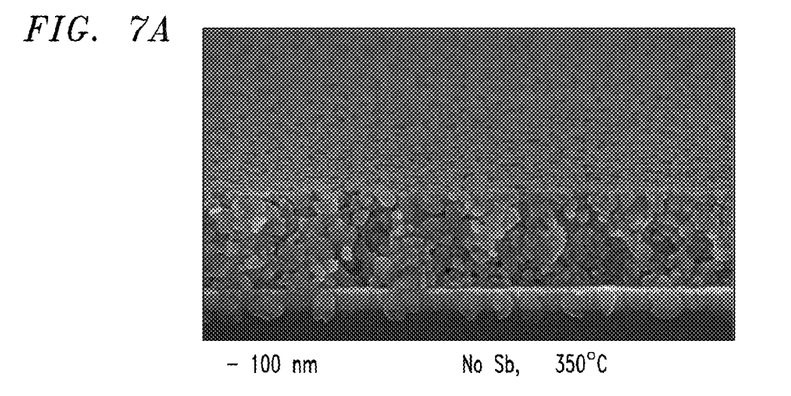
FIGS. 7A-B are cross-sectional SEM images of exemplary Sb-doped and undoped CIGS films both of which were processed at low temperatures according to an embodiment of the present invention.
Figure 7B:
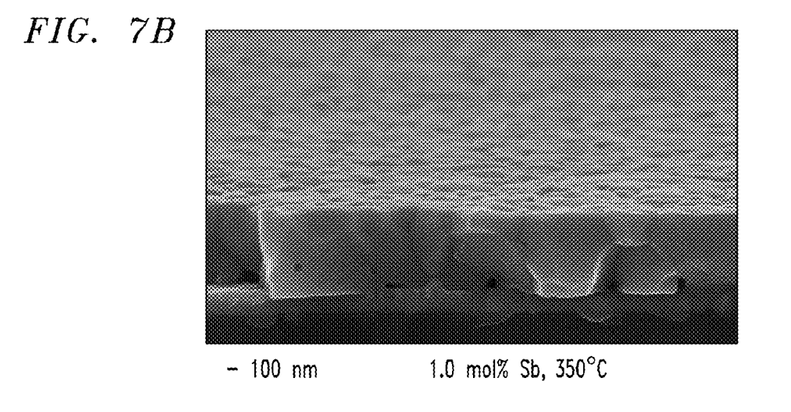

FIGS. 7A-B are cross-sectional SEM images of undoped (FIG. 7A) and Sb-doped (one mol %, i.e., $CuIn_{0.7}Ga_{0.3}Sb_{0.01}Se_2$) (FIG. 7B) $CuIn_{0.7}Ga_{0.3}Se_2$ films, both of which had a final anneal at 350° C. for 40 minutes. Each of the films was deposited using the above-described approach (using five successive depositions to generate a film thickness of about 550 nm). In each case, the film was deposited on Mo-coated glass (i.e., with 100 nm of Mo deposited by sputtering). All heat treatments were performed in the same nitrogen-filled drybox as that used for spin-coating. The dramatic grain size enhancement effect under a rather low annealing temperature (350° C.) is notable. Thus, the Sb-doping method allows one to achieve device-quality grain structures under low processing temperatures (less than or equal to 400° C.) which are compatible with polyimide-based substrates.

Example 2

The CIGS absorber layers described above were incorporated into two working photovoltaic devices having the structure of photovoltaic device 100, described in conjunction with the description of FIG. 1, above, with the CIGS absorber layers deposited using the spin-coating method described in Example 1 (above), containing zero or 0.2 mol % of Sb dopant, respectively. The CIGS layers were annealed at 525° C. for 15 minutes as final heat treatments. A one inch×one inch soda-lime glass plate (0.04 inch thickness) with about 600 nm of Mo sputtered thereon formed the back contact of the device.

For each component solution, the solid components were weighed and the solutions were formed in a nitrogen-filled glove box with water and oxygen levels maintained below one part per million (ppm). Five component solutions, i.e., component solutions (a)-(e) for the CIGS absorber layer were prepared by dissolving a Cu source, an In source, a Ga source, an Se source and an Sb source in hydrazine as follows.

Component solution (a) ($Cu_2S$) was formed by mixing 10 mmol $Cu_2S$ (1.592 g), 20 mmol S (0.6413 g) and 20.0 mL of anhydrous hydrazine (Sigma-Aldrich Co., Saint Louis, Mo., anhydrous, 98%), leading to a clear yellow solution after several days of stirring.

Component solution (b) ($In_2Se_3$) was formed by mixing 10 mmol $In_2Se_3$ (4.6652 g), 10 mmol Se (0.7896 g) and 30.0 mL hydrazine (Aldrich, anhydrous, 98%), yielding a viscous pale yellow solution.

Component solution (c) (gallium selenide ($Ga_2Se_3$)) was formed by mixing eight mmol Ga (557.79 mg) and 16 mmol Se (1,263.36 milligram (mg)) in 16 mL of hydrazine (Aldrich, anhydrous, 98%). After one week of stirring, essentially all the original Ga had dissolved, yielding a colorless solution, with generally a very small amount of undissolved material remaining at the end of this process.

Component solution (d) contained 10 mmol Se (789.6 mg) in five mL of hydrazine (Aldrich, anhydrous, 98%), forming a darkly colored solution.

Component solution (e) ($Sb_2S_3$) was formed by mixing one mmol $Sb_2S_3$ (339.72 mg), two mmol S (64.13 mg) and two mL of anhydrous hydrazine (Aldrich, anhydrous, 98%), leading to a clear bright yellow solution after two days of stirring.

Two CIGS absorber layer precursor solutions, i.e., Solution F and Solution G, were prepared by mixing the appropriate amounts of the component solutions described above for the CIGS film deposition. Solution F targeting $Cu_{1-y}In_{1-x}Ga_xSe_{2-z}S_z$ film (y=0.18, x=0.3, z≈zero) with no Sb was formed by mixing 3.69 mL component solution (a) (3.69 mmol Cu), 4.725 mL component solution (b) (3.15 mmol In), 2.7 mL component solution (c) (1.35 mmol Ga), 0.9 mL component solution (d) (1.8 mmol Se) and 1.845 mL hydrazine (Aldrich, anhydrous, 98%). Solution G targeting 0.2 mol % Sb-doped $Cu_{1-y}In_{1-x}Ga_xSe_{2-z}S_z$ film (y=0.18, x=0.3, z≈zero) was formed by adding three µL of component solution (e) (3×10$^{-3}$ mmol Sb) to 4.62 mL Solution F (containing 1.5 mmol In+Ga). Both Solutions F and G were allowed to stir for one day at room temperature before deposition. Using these two Solutions (F and G), two films of CIGS precursor were spin-coated (800 rpm, 90 seconds) onto glass/Mo substrates.

The films were dried and partially decomposed using a short (five minute) treatment at 290° C. in an inert atmosphere. Nine additional CIGS layers were deposited in the same way for each film to build up film thickness, after which the film was subjected to a final anneal at 525° C. for 15 minutes.

The CdS buffer layer (about 50 nm thick) was deposited using a standard chemical bath deposition approach similar to that described in Contreras (2002). Approximately 70 nm of high resistivity intrinsic ZnO was sputtered onto the CdS. A conducting ITO layer was deposited to form a nominally transparent conductive top contact using a sputtering technique and targeting a thickness of 200 nm. A Ni (50 nm)/Al (two µm) metal grid was electron-beam (e-beam) evaporated through a shadow mask on top of the ITO layer to facilitate current collection.

Figure 8:
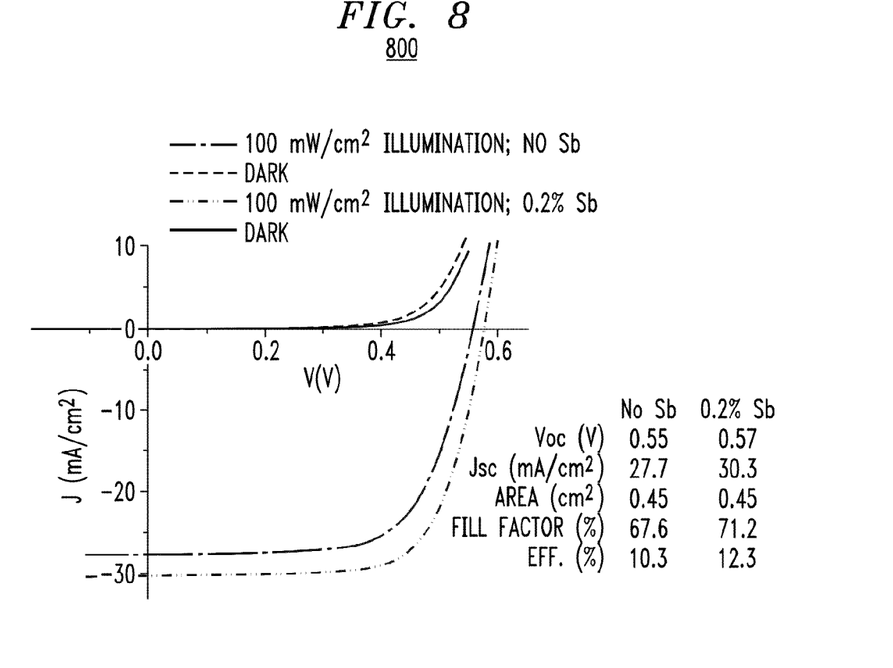
FIG. 8 is a graph illustrating current density (J) versus voltage (V) curves for exemplary Sb-doped (0.2 mole percent (mol %)) and undoped photovoltaic devices processed at 525 degrees Celsius (° C.) according to an embodiment of the present invention.

FIG. 8 is graph 800 illustrating current density (J) versus voltage (V) curves across the device structure for both an Sb-doped (0.2 mol %, i.e., $Cu_{0.82}In_{0.7}Ga_{0.3}Sb_{0.002}Se_2$) photovoltaic device and an undoped photovoltaic device both fabricated on soda lime glass substrates. Both photovoltaic devices were fabricated in the same fashion as one another except for the addition of Sb into one of them.

The black curves correspond to measurements made in the dark, and the grey curves correspond to measurements made under illumination (one sun, i.e., 100 milliwatts per square centimeter (mW/cm$^2$), using a solar simulator). The Sb-doped device showed superior device characteristics (open circuit voltage (Voc), short circuit current density (Jsc) and fill factor (FF)) compared to the undoped control device. While the undoped device had a Voc of 0.55 volts (V), a Jsc of 27.7 milliamps per square centimeter (mA/cm$^2$) and an overall efficiency (Eff.) of 10.3%, the Sb-doped device yielded a Voc of 0.57 V, a Jsc of 30.3 mA/cm$^2$ and an overall efficiency of 12.3%. Each device had the same area, i.e., 0.45 square centimeters (cm$^2$).

Example 3

This example illustrates a working CIGS photovoltaic device fabricated in a same manner as described in conjunction with the description of Example 2, above, containing a small amount of Sb dopants, and processed at a relatively low temperature (375° C. maximum temperature). A one inch× one inch soda-lime glass plate (0.04 inch thickness) with about 600 nm of Mo sputtered thereon formed a back contact of the device.

For each component solution, the solid components were weighed and the solutions were formed in a nitrogen-filled glove box with water and oxygen levels maintained below one ppm (as for the other examples). Five component solutions, i.e., component solutions (a)-(e), for the CIGS layer were prepared by dissolving a Cu source, an In source, a Ga source, an Se source and an Sb source in hydrazine as follows.

Component solution (a) ($Cu_2S$) was formed by mixing 10 mmol $Cu_2S$ (1.592 g), 20 mmol S (0.6413 g) and 20.0 mL of anhydrous hydrazine (Aldrich, anhydrous, 98%), leading to a clear yellow solution after several days of stirring.

Component solution (b) ($In_2Se_3$) was formed by mixing 10 mmol $In_2Se_3$ (4.6652 g), 10 mmol Se (0.7896 g) and 30.0 mL hydrazine (Aldrich, anhydrous, 98%), yielding a viscous pale yellow solution.

Component solution (c) ($Ga_2Se_3$) was formed by mixing eight mmol Ga (557.79 mg) and 16 mmol Se (1263.36 mg) in 16 mL of hydrazine (Aldrich, anhydrous, 98%). After one week of stirring, essentially all of the original Ga had dissolved, yielding a colorless solution, with generally a very small amount of undissolved material remaining at the end of this process.

Component solution (d) contained 10 mmol Se (789.6 mg) in five mL of hydrazine (Aldrich, anhydrous, 98%), forming a darkly colored solution.

Component solution (e) ($Sb_2S_3$) was formed by mixing one mmol $Sb_2S_3$ (339.72 mg), two mmol S (64.13 mg) and two mL of anhydrous hydrazine (Aldrich, anhydrous, 98%), leading to a clear bright yellow solution after two days of stirring.

Two CIGS absorber layer precursor solutions, i.e., Solution F and Solution G, were prepared by mixing the appropriate amounts of the component solutions described above for the CIGS film deposition. Solution F targeting $Cu_{1-y}In_{1-x}Ga_xSe_{2-z}S_z$ film (y=zero, x=0.3, z≈zero) with 0.5 mol % Sb was formed by mixing two mL component solution (a) (two mmol Cu), 2.1 mL component solution (b) (1.4 mmol In), 1.2 mL component solution (c) (0.6 mmol Ga), 0.8 mL component solution (d) (1.6 mmol Se), 10 μL component solution (e) (0.01 mmol Sb), and 0.06 mL hydrazine (Aldrich, anhydrous, 98%). Solution G targeting $Cu_{1-y}In_{1-x}Ga_xSe_{2-z}S_z$ film (y=0.75, x=0.3, z≈zero) was formed by mixing 0.25 mL component solution (a) (0.25 mmol Cu), 1.05 mL component solution (b) (0.7 mmol In), 0.6 mL component solution (c) (0.3 mmol Ga), 0.4 mL component solution (d) (0.8 mmol Se) and 0.78 mL hydrazine (Aldrich, anhydrous, 98%). Both Solutions F and G were allowed to stir for one day at room temperature before the deposition.

Using these two solutions (F and G), a film of CIGS precursor was spin-coated (800 rpm, 90 seconds) onto the glass/Mo substrate. The film was dried and partially decomposed using a short (five minute) treatment at 290° C. in an inert atmosphere after each deposition. Eight layers were deposited in this manner using Solution F, followed by a thermal anneal at 375° C. for 15 minutes after the eighth deposition. Two layers of Solution G (with intermediate anneal at 375° C. for 10 minutes) were then deposited to build up film thickness, after which the film was subjected to a final anneal at 375° C. for 20 minutes. The Sb-doped layers (Solution F) were put down first to achieve large-grained bottom layers, and the top two layers (Solution G) were put down to adjust the final film to an overall Cu-poor stoichiometry. The other layers of the device (CdS, ZnO, ITO and Ni/Al metal grid) were put down as described in conjunction with the description of Example 2, above.

Figure 9:
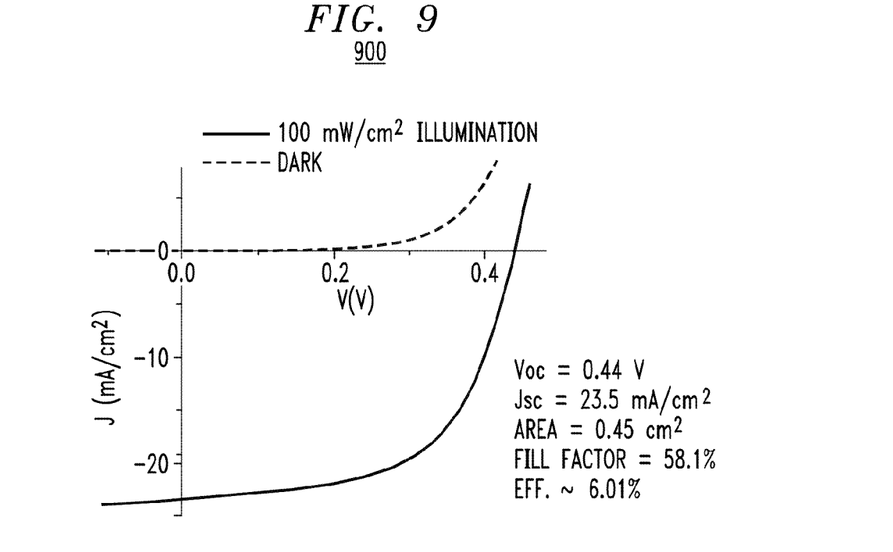
FIG. 9 is a graph illustrating J versus V curves for an exemplary Sb-doped (0.5 mol %) photovoltaic device processed at 375° C. according to an embodiment of the present invention.

FIG. 9 is graph 900 illustrating J versus V curves across the device structure for the 0.5 mol % (i.e., $Cu_{0.85}In_{0.7}Ga_{0.3}Sb_{0.005}Se_2$) Sb-doped CIGS photovoltaic device fabricated on a soda lime glass substrate. The dashed curve corresponds to a measurement made in the dark and the solid curve corresponds to a measurement made under one sun, i.e., 100 mW/cm² illumination.

Despite the fact that the device performances presented in FIG. 8 and FIG. 9 represent only initial experimental results, with no full optimization conducted on the various device layers (i.e., Mo back contact, CdS, ZnO/ITO bilayer, as well as the CIGS absorber layer), an efficiency of six % was already obtained under a mild thermal treatment condition (375° C.) (the growth conditions of the various device layers, such as pressure and temperature during Mo growth, temperature and duration time during CdS growth, pressure/temperature and oxygen level during the ZnO/ITO bilayer growth and chemical compositional tuning and heat treatment during the CIGS layer growth, once fully optimized, will further improve the device performance). This result demonstrates the potential of the present Sb-doping techniques to be applied in the fabrication of flexible thin film photovoltaic devices, where flexible lightweight substrates such as polyimide-based materials or other high temperature polymer materials (which can only take processing temperatures up to about 400° C.) are used to facilitate roll-to-roll manufacturing production.

Example 4

The applicability of the Sb-doping techniques described herein extends beyond the hydrazine-based spin-coating techniques described in conjunction with the description of Examples 1-3, above. The present techniques can be conveniently incorporated into other high throughput solution-based deposition techniques, such as ink jet printing and spray deposition, as well as into conventional vacuum-based techniques, to deposit the CIGS absorber layer of a photovoltaic device.

This example demonstrates the incorporation of the present Sb-doping scheme into solution-processed deposition techniques wherein a nanoparticle precursor ink is used to deposit the CIGS absorber layer component of a photovoltaic device. These deposition techniques include, but are not limited to, doctor blading, ink jet printing, roller coating, spraying, stamping and dip coating. There are two general approaches for preparing the nanoparticle precursor ink, such as those employed by International Solar Electric Technology, Inc. (ISET), Chatsworth, Calif. and Nanosolar, Palo Alto, Calif. They rely on forming a suspension of Cu, In and Ga oxide (ISET) or metal nanoparticles (Nanosolar) in a solution. The prepared ink can then be deposited onto a Mo-coated substrate during the device fabrication. When an oxide precursor (Cu, In and Ga oxide) is used (ISET recipe), the dried (usually at 130° C.) precursor is first reduced under a hydrogen atmosphere at high temperature to form a Cu—In—Ga metal-alloy layer. This metal-alloy layer is then annealed under hydrogen selenide ($H_2Se$) (again at high temperature) to form the CIGS absorber layer (see, V. K. Kapur et al., "Nanoparticle Oxides Precursor Inks for Thin Film Copper Indium Gallium Selenide (CIGS) Solar Cells," *Mat. Res. Soc. Symp. Proc.* vol. 668, H2.6.1 (2001) (hereinafter "Kapur"), the contents of which are incorporated by reference herein.)

Sb-doping can be conveniently incorporated into the above-described nanoparticle-based solution deposition techniques. By way of example only, in the ISET approach, Sb-doping can be easily realized by adding Sb as a starting element in the preparation of the ink. The ISET process starts with dissolving a pre-mixed elemental Cu, In and Ga mixture in an acid (such as sulfuric acid or nitric acid) in a desired ratio to form a homogeneously mixed aqueous solution (see, Kapur). Thus, the modified Sb-doping process would involve addition of elemental Sb or an acid-soluble Sb-containing compound, including, but not limited to, antimony oxide ($Sb_2O_3$), to the Cu, In and Ga pre-mixture in an appropriate ratio (targeting from about 0.1 mol % to about two mol % of Sb in the end product) for acid digestion. Mixed hydroxides are then co-precipitated by adding in sodium hydroxide (NaOH) or an equivalent base solution. The mixed hydroxide precipitate is filtered and washed before being thermally converted to an oxide powder. Water and a proper dispersing agent are added to the oxide powder and the mixture is then ball-milled into an ink for deposition, as described in the ISET process.

The precursor ink can be coated on metallized substrates using various techniques, such as doctor blading, ink jet printing, roller coating, spraying, stamping and dip coating. Oxide reduction followed by selenization are carried out to convert the compound film to the final Sb-doped CIGS composition in a targeted ratio. The Sb dopant improves the CIGS film grain structure by helping to achieve larger grains for a given processing temperature, or by helping to lower processing temperatures with no degradation of the grain size. Photovoltaic devices with the Sb-doped CIGS absorber layers are expected to exhibit superior device characteristics as compared to cells prepared under the same conditions but without Sb-doping.

The present teachings are directed to the purposeful introduction (doping) of a controlled amount of Sb into a CIGS film, which is integrated into a photovoltaic device and, by doing so, achieving improved film properties (in particular, improved grain sizes) and device performance. The Sb-doping can be implemented through various means, including, but not limited to, those highlighted in the examples given above. Alternatively, instead of including Sb in the starting materials in a homogeneous manner for film deposition, Sb doping can also be achieved by applying an individual layer of an Sb-containing compound (such as $Sb_2S_3$ or antimony selenide ($Sb_2Se_3$)) either before or after the deposition of the CIGS film (without a final anneal yet), followed by thermal treatments to convert the materials to a final form of an Sb-doped CIGS film.

Example 5

This example demonstrates how Sb-doping can be performed using traditional vacuum-based techniques for depositing CIGS in thin-film photovoltaic applications. Sb-doping into CIS (Ga-free) thin films using vacuum-based techniques is described for example, in Tseng et al., "Influences of Sb on the Growth and Properties of $CuInSe_2$ Thin Films," *Jpn. J. Appl. Phys.* vol. 34, 1109-1112 (1995) (hereinafter "Tseng") (films grown by molecular beam deposition in the presence of an Sb-beam flux) and in S. Kuranouchi et al., "Sb Doping Effect on Electrical Properties of $CuInSe_2$ Thin Films," $2^{nd}$ *World Conference and Exhibition on Photovoltaic Solar Energy Conversion*, July 6-10, 612-615 (1998) (hereinafter "Kuranouchi") (films grown by laser ablation with integrated $Sb_2Se_3$ powder in a CIS target), the contents of both of which are incorporated by reference herein.

However, the conclusions derived from Tseng and Kuranouchi were somewhat contradictory to each other. In the molecular beam deposited films, the Sb-content was found to be highest near the film surface but decreased dramatically away from the surface. Thus, it was concluded in Tseng that Sb was acting as a surfactant on the growth of the CIS film leading to a smoother surface and a more compact grain structure. In the laser-ablated CIS films, the Sb-concentrations in the films were minimal and did not vary much despite the Sb-content in the target being varied from about zero mol % to about 30 mol %. Interestingly, the doped Sb atoms were found to be distributed homogenously in the films, as opposed to the surface segregation of Sb atoms observed by the molecular beam deposited films. It was concluded in Kuranouchi that the grain size and crystallinity of the films were not dependent on Sb content in the films. It is possible that in Tseng and Kuranouchi the actual Sb-inclusion level in the final CIS film was too low for a grain size enhancement effect to be observed.

The deposition of Sb, $Sb_2S_3$ or $Sb_2Se_3$ thin films using vapor techniques is well developed. See, for example, N. Tigau, "Substrate Temperature Effect on the Optical Properties of Amorphous $Sb_2S_3$ Thin Films," *Crystal Research and Technology*, vol. 41, 474-480 (2006); and J. Nagao et al., "Ionized Cluster Beam Deposition of Antimony and Bismuth Films," *J. Phys. D: Appl. Phys.*, vol. 32, 134-138 (1999), the contents of both of which are incorporated by reference herein. Accordingly, an alternative deposition approach would be to deposit an Sb-source thin film, such as an Sb, $Sb_2S_3$ or $Sb_2Se_3$ thin film, separately either before or after deposition of a CIGS film (for example, $Sb_2S_3$ may be used if intentional S-introduction is preferred), using a deposition technique which is compatible with that used to deposit the CIGS film (evaporation for example) (so that no vacuum-break is necessary). Sb-content in the resulting film can be tailored by varying the relative ratio of the Sb-source film and the CIGS film. Characterization of individual Sb-source films, coupled with effective monitoring of deposition rate, can be used to determine the proper deposition parameters for a targeted film stoichiometry (including Sb-doping level, which is from about 0.1 mol % to about 2.0 mol %). As relatively high temperatures (greater than or equal to about 450° C.) are usually employed in vacuum deposition of a CIGS film, Sb atoms are expected to gather at the Mo-CIGS film interface under these high temperature conditions, as described in Example 1 (above), regardless of the deposition sequence of the Sb-source film relative to CIGS. The above description should not rule out the possibility that effective Sb-inclusion can be accomplished through other equivalent methods, such as co-evaporation of an Sb-source and the CIGS source materials, or sputtering from either a separate Sb-source or an alloyed target containing Sb.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a photovoltaic device, comprising the steps of:
   providing a substrate; and
   forming an Sb-doped absorber layer formed on the substrate represented by a formula, $Cu_{1-y}In_{1-x}Ga_xSb_zSe_{2-w}S_w,$ wherein:
   $0 \leq x \leq 1$, and ranges therebetween;
   $0 \leq y \leq 0.2$, and ranges therebetween;
   $0.001 \leq z \leq 0.02$, and ranges therebetween;
   $0 \leq w \leq 2$, and ranges therebetween,
   wherein an amount of Sb in the absorber layer is from about 0.1 atomic percent to about 2 atomic percent of that of a sum of the In and the Ga,
   and wherein the absorber layer has a grain size of from about 0.2 μm to about two μm measured as a longest length of a grain from a cross-section of the absorber layer, and wherein the longest length of the grain from the cross-section of the film is greater than or equal to a thickness of the film; and
   performing a final anneal of the absorber layer at a temperature of from about 350° C. to about 375° C., wherein the step of forming the Sb-doped absorber layer further comprises the steps of:

preparing an Sb-doped absorber layer precursor solution;

spin-coating the Sb-doped absorber layer precursor solution onto the substrate;

annealing the Sb-doped absorber precursor layer coated on the substrate, wherein the annealing step comprises an intermediate anneal that is configured to decompose the Sb-doped absorber precursor layer coated on the substrate; and repeating the spin-coating and annealing steps until a desired thickness for the Sb-doped absorber layer is achieved, wherein the spin-coating and annealing steps are all performed in-situ in a same inert atmosphere, in a same nitrogen-filled drybox, and wherein the step of preparing the Sb-doped absorber layer precursor solution, further comprises the step of:

dissolving a Cu source, an In source, a Ga source, an Se source and an Sb source in hydrazine to produce one or more component solutions, wherein the Sb source is antimony trisulfide; and mixing two or more of the component solutions to form the Sb-doped absorber layer precursor solution.

2. The method of claim 1, further comprising the steps of:

forming an n-type buffer layer on a side of the Sb-doped absorber layer opposite the substrate;

forming a transparent conductive contact on a side of the buffer layer opposite the Sb-doped absorber layer; and forming a metal grid on a side of the transparent conductive contact opposite the buffer layer.

3. The method of claim 1, wherein the substrate comprises glass, metal foil or a polyimide sheet, the method further comprising the step of:

sputtering Mo, W or Cr onto the glass, metal foil or polyimide sheet to a thickness of from about 0.5 µm to about one µm.

4. The method of claim 1, further comprising the step of:

performing the final anneal after the desired thickness for the Sb-doped absorber layer has been achieved.

* * * * *